(12) United States Patent
Park

(10) Patent No.: US 7,759,021 B2
(45) Date of Patent: Jul. 20, 2010

(54) MULTI-TRANSMISSION PHASE MASK AND EXPOSURE METHOD USING THE SAME

(75) Inventor: Chan Ha Park, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 1082 days.

(21) Appl. No.: 11/077,296

(22) Filed: Mar. 9, 2005

(65) Prior Publication Data

US 2006/0134530 A1     Jun. 22, 2006

(30) Foreign Application Priority Data

Dec. 22, 2004   (KR) .................... 10-2004-0110510

(51) Int. Cl.
*G03F 1/00* (2006.01)
(52) U.S. Cl. .......................... 430/5; 430/311
(58) Field of Classification Search ................ 430/311, 430/5; 716/21, 19
See application file for complete search history.

(56) References Cited

U.S. PATENT DOCUMENTS

| | | | | |
|---|---|---|---|---|
| 5,466,904 A * | 11/1995 | Pfeiffer et al. | ......... | 219/121.25 |
| 5,521,033 A | 5/1996 | Okamoto | | |
| 5,994,001 A | 11/1999 | Nakao | | |
| 6,022,645 A * | 2/2000 | Lin | ............... | 430/5 |
| 6,787,274 B2 * | 9/2004 | Park | .............. | 430/5 |
| 2003/0235766 A1 | 12/2003 | Park | | |
| 2004/0048167 A1 * | 3/2004 | Smith | .............. | 430/5 |
| 2004/0166422 A1 * | 8/2004 | Yamazoe et al. | ............. | 430/5 |
| 2005/0042527 A1 * | 2/2005 | Pierrat | ............. | 430/5 |
| 2005/0089764 A1 * | 4/2005 | Lu et al. | ............. | 430/5 |

FOREIGN PATENT DOCUMENTS

| | | |
|---|---|---|
| JP | 2001-042545 | 2/2001 |
| JP | 2004-029806 | 1/2004 |
| JP | H08-146590 | 7/2006 |
| KR | 10-1998-0050140 | 9/1998 |
| KR | 10-1998-0015072 | 5/2005 |

\* cited by examiner

*Primary Examiner*—Mark F Huff
*Assistant Examiner*—Rashid Alam
(74) *Attorney, Agent, or Firm*—Townsend and Townsend and Crew LLP

(57) ABSTRACT

A multi-transmission phase mask, and an exposure method using the same are disclosed. The mask comprises a transparent substrate, a light shielding film formed on the transparent substrate and defining a light transmission region and a light shielding region, and a phase inversion region formed on a predetermined portion of the light transmission region so as to allow exposure light to be transmitted therethrough with a phase of the light being inverted. In the method, a pattern of a semiconductor diode is exposed on a wafer by illuminating exposure light to the multi-transmission phase mask through a modified illumination system comprising at least two poles, each having a preset opening angle. According to the present invention, a defect wherein a pattern unit of a storage node contact pattern is not regularly opened on a wafer, or a defect wherein the pattern units are bridged to each other can be prevented from occurring.

14 Claims, 9 Drawing Sheets

| mask size | simulation CD | MEF |
|---|---|---|
| 93nm | 103.7nm | |
| 90nm | 95.0nm | 11.8 |
| 87nm | 86.1nm | |

…

MULTI-TRANSMISSION PHASE MASK AND EXPOSURE METHOD USING THE SAME

CROSS-REFERENCES TO RELATED APPLICATIONS

This application claims the benefit of Korean Patent Application No. 10-2004-110510 filed Dec. 22, 2004, the entire contents of which are hereby incorporated by reference for all purposes

FIELD OF INVENTION

The present invention relates to a multi-transmission phase mask, and an exposure method using the same, and more particularly to a multi-transmission phase mask, designed to realize a critical dimension of a minute pattern of the mask with high precision, and an exposure method using the same.

BACKGROUND OF THE INVENTION

According to increasing requirement for high integration and high density of a semiconductor device, a photolithography technology for realizing a high resolution has been studied and developed in order to form a more minute pattern on a wafer. The resolution R of an exposure apparatus is defined by Equation 1, in which k1 is a fixed number corresponding to a process, λ is the wavelength of exposure light, and NA is the number of lens apertures in the exposure apparatus;

$$R = k1 \frac{\lambda}{NA} \qquad 1$$

As shown in Equation 1, in order to achieve a high resolution, the number NA of the lens apertures in the exposure apparatus must be increased, and the wavelength of the exposure light must be decreased. Accordingly, the wavelength of the exposure light practically used for the exposure apparatus has been gradually decreased from I-ray (365 nm) to a KrF Excimer laser (248 nm), an ArF Excimer laser (193 nm), an F2 laser (157 nm), and the like.

FIG. 1 shows a mask having a storage node contact pattern according to a conventional technology using the KrF laser. As shown in FIG. 1, when using the KrF laser, if sizes of the storage node contacts on the mask are 93 nm, 90 nm and 87 mm, critical dimensions of simulation contacts become 103.7 nm, 95.0 nm and 86.1 nm, respectively. A mask error factor in this case is about 11.8, which causes drastic changes in dimensions of a pattern on a wafer due to slight changes in dimensions of a pattern on the mask. Accordingly, considering that an acceptable mask error factor for mass production is less than 5, it can be appreciated that a mask error factor of 11.8 is remarkably high.

FIG. 2 shows a storage node contact pattern exposed on a wafer by the conventional technology. As shown in FIG. 2, when a storage node contact pattern having a half pitch of 90 nm on a 6% half tone mask is exposed to a wafer by means of a 0.80 NA KrF exposure apparatus using the mask, there occurs a defect "b" wherein a pattern unit of the minute storage node contact pattern is not regularly opened on the wafer or a defect "c" wherein the pattern units are bridged to each other.

FIG. 3a shows an irregular pattern caused by an error on the mask having the storage node contact pattern according to the conventional technology, and FIG. 3a shows a defective pattern on the wafer caused thereby.

As shown in FIGS. 3a and 3b, it can be appreciated that there occurs a defect wherein a pattern unit of the storage node contact pattern is not regularly opened on the wafer due to the error on the mask caused by repetitious arrangement of the storage node contact pattern.

As such, according to the conventional technology, there is a problem in that, when using the KrF laser, the critical dimension of the minute pattern, such as a minute storage node contact pattern, is not realized with high precision.

BRIEF SUMMARY OF THE INVENTION

The present invention has been made to solve the above problems, and it is an object of the present invention to provide a multi-transmission phase mask, which is provided at a predetermined portion of a light transmission region with a phase inversion region for allowing light to be transmitted in an inverted state, thereby realizing a critical dimension of a minute and repetitious pattern of a semiconductor diode with high precision.

It is another object of the present invention to provide an exposure method using a modified illumination system and a multi-transmission phase mask, which is provided at a predetermined portion of a light transmission region with a phase inversion region for allowing light to be transmitted in a state of being inverted, thereby realizing a critical dimension of a minute and repetitious pattern of a semiconductor diode with high precision upon the exposure process.

In accordance with one aspect of the present invention, the above and other objects can be accomplished by the provision of a multi-transmission phase mask used for an exposure apparatus, comprising: a transparent substrate; a light shielding film formed on the transparent substrate and defining a light transmission region and a light shielding region; and a phase inversion region formed on a predetermined portion of the light transmission region so as to allow light to be transmitted therethrough with the light phase inverted.

In accordance with another aspect of the present invention, an exposure method using a multi-transmission phase mask used for an exposure apparatus is provided, the multi-transmission phase mask comprising: a transparent substrate; a light shielding film formed on the transparent substrate and defining a light transmission region and a light shielding region; and a phase inversion region formed on a predetermined portion of the light transmission region so as to allow light to be transmitted therethrough with a phase of the light being inverted, wherein a pattern of a semiconductor diode is exposed on a wafer by illuminating exposure light to the multi-transmission phase mask through a modified illumination system comprising at least two poles, each having a preset opening angle.

The phase inversion region may be formed by etching the transparent substrate to a predetermined depth.

The phase inversion region has a phase difference of 180° to the light transmission region.

The phase inversion region may be formed in a row direction of the light transmission region defined in the light shielding film.

The phase inversion region may be formed in a column direction of the light transmission region defined in the light shielding film.

The exposure light may be produced by a KrF laser, ArF laser or F2 laser.

The light shielding film may be one of a chrome film and a halftone film allowing a portion of light to be transmitted while inverting the light phase.

The light shielding film may be a selective combination of a chrome film and a half tone film allowing a portion of light to be transmitted while inverting the phase of the light.

The multi-transmission phase mask may further comprise another phase inversion region at a predetermined portion where the phase inversion region does not contact the light transmission region.

The exposure method may be an immersion type exposure method.

The modified illumination system may have a hexapole.

BRIEF DESCRIPTION OF THE DRAWINGS

The foregoing and other objects and features of the present invention will be more clearly understood from the following detailed description taken in conjunction with the accompanying drawings, in which.

DETAILED DESCRIPTION OF THE INVENTION

Preferred embodiments will now be described in detail with reference to the accompanying drawings. It should be understood that the embodiments are not provided for the purpose of limiting the scope of the invention, but only for the purpose of illustration.

Figure 1:
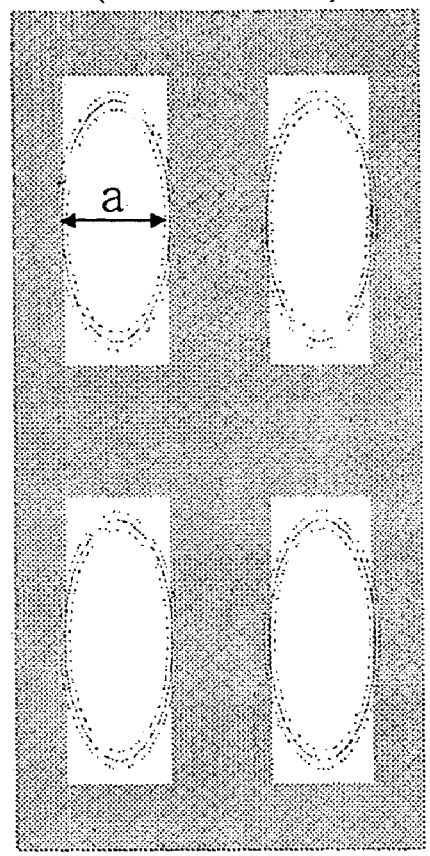
FIG. 1 shows a mask having a storage node contact pattern according to conventional technology.
Figure 2:
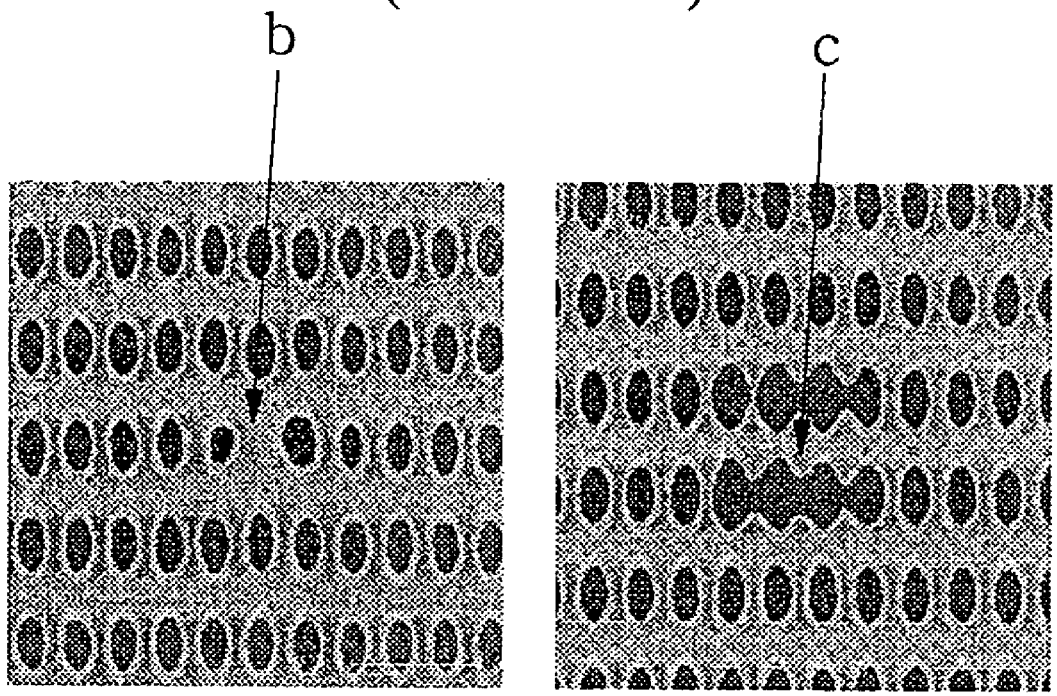
FIG. 2 shows a storage node contact pattern exposed on a wafer by the conventional technology.
Figure 3A:
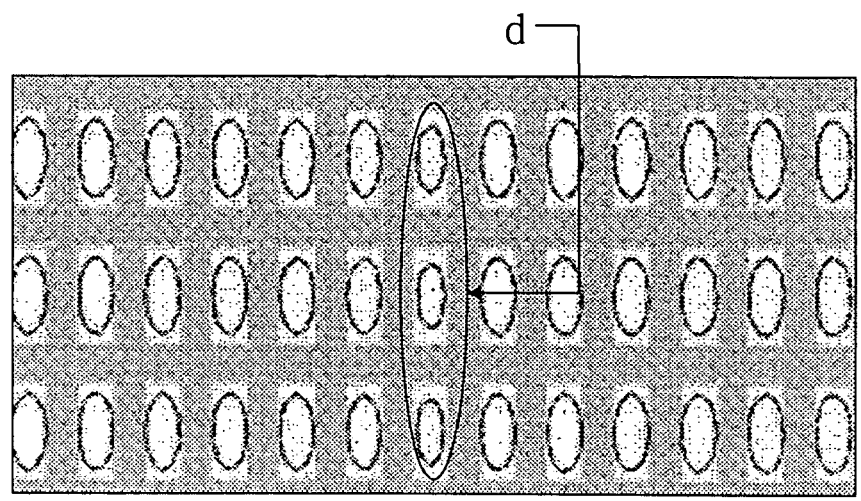
FIGS. 3a and 3b show an irregular pattern caused by an error on the mask having the storage node contact pattern according to conventional technology, and a defective pattern on the wafer caused thereby.
Figure 3B:
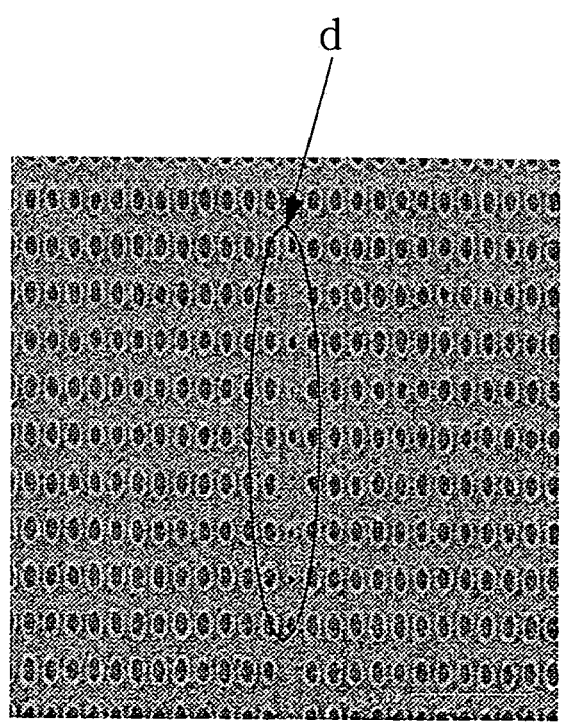
Figure 4:
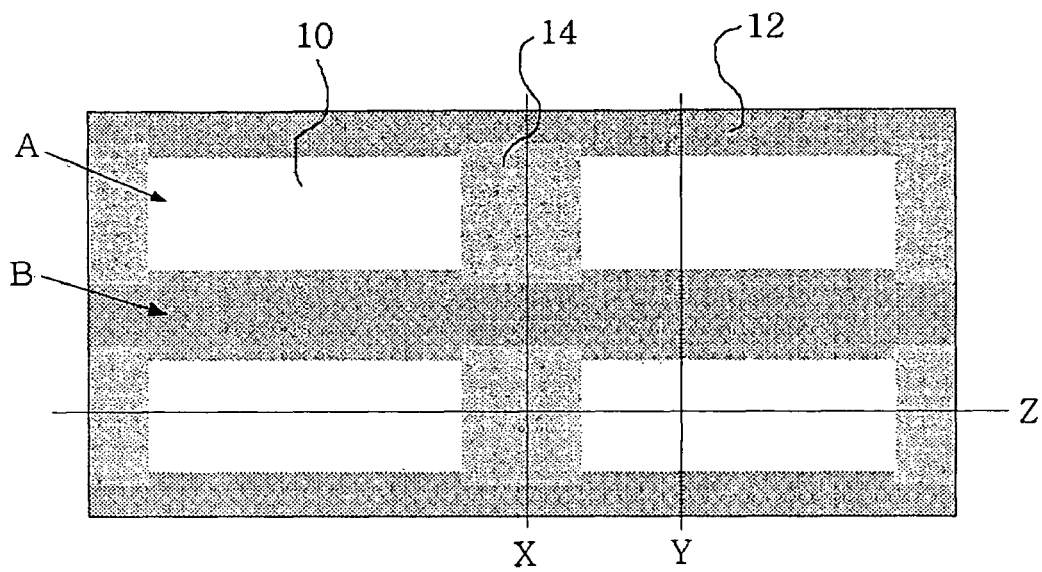
FIG. 4 is a plan view illustrating a multi-transmission phase mask in accordance with one preferred embodiment of the present invention.

FIG. 4 is a plan view of a multi-transmission phase mask according to one preferred embodiment of the invention.

Referring to FIG. 4, the multi-transmission phase mask in accordance with one embodiment of the invention comprises: a transparent substrate 10; a light shielding film 12 formed on the transparent substrate 10 and defining a light transmission region A and a light shielding region B; and a phase inversion region 14 formed on a predetermined portion of the light transmission region A so as to allow light to be transmitted therethrough with an inverted phase of the light. At this time, the transparent substrate 10 provides a phase delay of 0° for transmitted light, while the phase inversion region 14 provides a phase delay of 180°. Particularly, the phase inversion region 14 is formed by etching the transparent substrate 100 to a predetermined depth in order to provide the phase delay of 180°. Accordingly, a phase difference of 180° arises between the light transmitted through the light transmission region A and light transmitted through the phase inversion region 14.

In the above construction, one of a chrome film and a half tone film, which allows a portion of light to be transmitted while inverting the phase of the light, is used for the light shielding film 12. Alternatively, a selective combination of the chrome film and the half tone film allowing some portion of light to be transmitted while an inverted phase of the light may be used for the light shielding film 12.

Figure 5A:
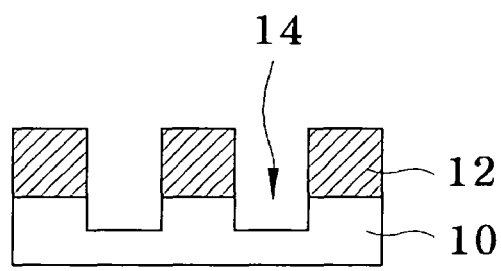
FIGS. 5a to 5c are vertical cross-sectional views taken along lines X-X, Y-Y and Z-Z of FIG. 4, respectively.
Figure 5B:
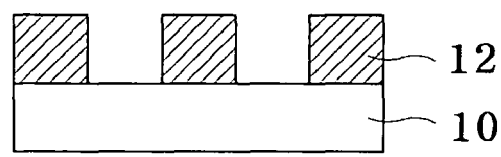
Figure 5C:
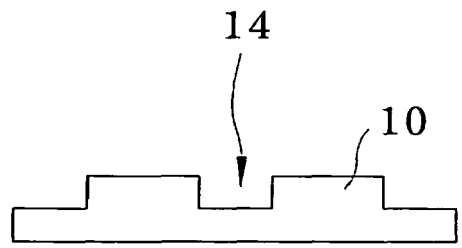

FIGS. 5a to 5c are vertical cross-sectional views taken along lines X-X, Y-Y and Z-Z of FIG. 4, respectively.

FIG. 5a is a vertical cross-sectional view of the multi-transmission phase mask taken along the line X-X of FIG. 4, in which a portion of the transparent substrate 10 etched to a predetermined depth in the light shielding film 12 is the phase inversion region 14.

FIG. 5b is a vertical cross-sectional view of the multi-transmission phase mask taken along the line Y-Y of FIG. 4, in which the exposed portion of the transparent substrate 10 is the transmission region A.

FIG. 5c is a vertical cross-sectional view of the multi-transmission phase mask taken along the line Z-Z of FIG. 4, in which a portion of the transparent substrate 10 etched below the surface of the transmission region A is the phase inversion region 14.

As such, when an exposure process is performed by means of an exposure apparatus, such as a KrF exposure apparatus, using the multi-transmission mask according to the present embodiment for forming a storage node contact pattern, the phase difference of 180° arises between the light transmitted through the light transmission region A, which will be formed with a storage node contact pattern and so forth, and the light transmitted through the phase inversion region 14 formed in the light transmission region A in the direction of the row. As a result, a countervailing phenomenon between phases of the light arises at the portion where the light transmission region A contacts the phase inversion region 14, thereby allowing the shape of the pattern to be maintained within a predetermined range without being significantly affected by changes of mask size. Accordingly, with the multi-transmission phase mask according to the present embodiment, the defect wherein a pattern unit of the storage node contact pattern is not regularly opened on the wafer due to the optical proximity phenomenon occurring in a gap between the storage node contacts, or where the pattern units are bridged to each other can be prevented from occurring.

Figure 6:
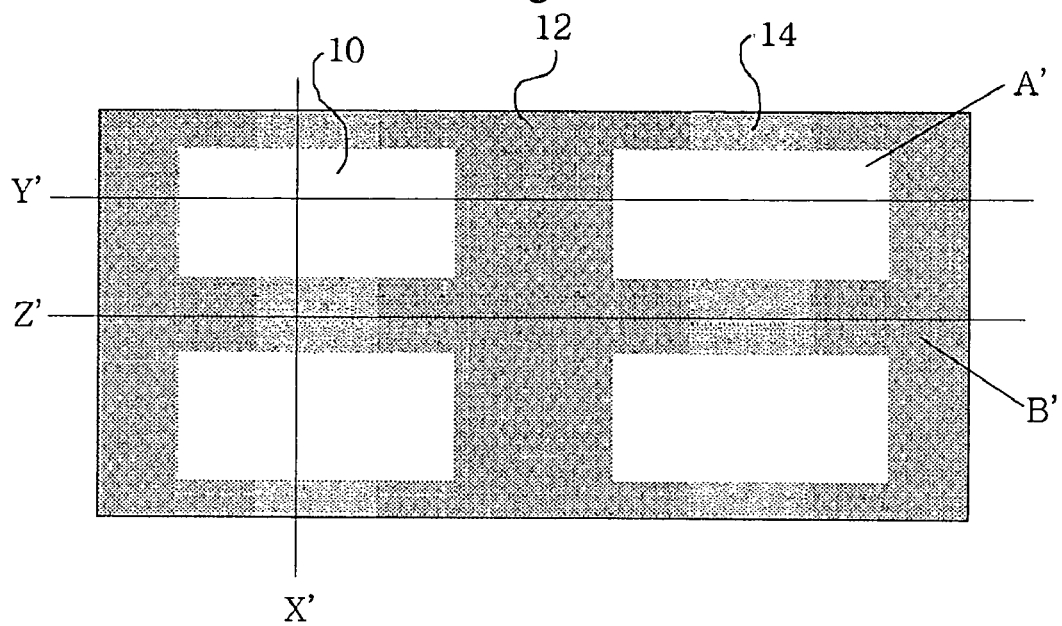
FIG. 6 is a plan view illustrating a multi-transmission phase mask in accordance with another preferred embodiment of the present invention.

FIG. 6 is a plan view illustrating a multi-transmission phase mask in accordance with anther embodiment of the invention. Referring to FIG. 6, the multi-transmission phase mask in accordance with another embodiment comprises: a transparent substrate 10; a light shielding film 12, such as a chrome film, formed on the transparent substrate 10 so as to shield light from transmitting through the light shielding film 12 for defining a light transmission region A' and a light shielding region B' in the light shielding film 12; and a phase inversion region 14 formed by etching the transparent substrate 10 to a predetermined depth in the light transmission region A' in a column direction. At this time, the etching depth must be controlled such that a phase difference of 180° arises between light transmitted through the light transmission region A' and light transmitted through the phase inversion region 14.

In the above construction, one of a chrome film and a half tone film, which allows a portion of light to be transmitted while inverting the phase of the light, is used for the light shielding film 12. Alternatively, a selective combination of the chrome film and the halftone film allowing some portion of light to be transmitted while inverting the phase of the light may be used for the light shielding film 12.

Figure 7A:
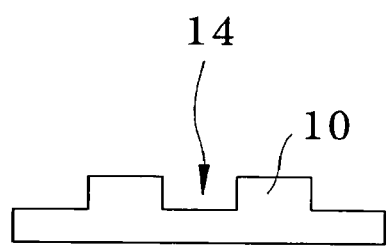
FIGS. 7a to 7c are vertical cross-sectional views taken along lines X'-X', Y'-Y' and Z'-Z' of FIG. 6, respectively.
Figure 7B:
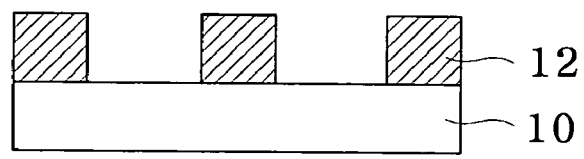
Figure 7C:
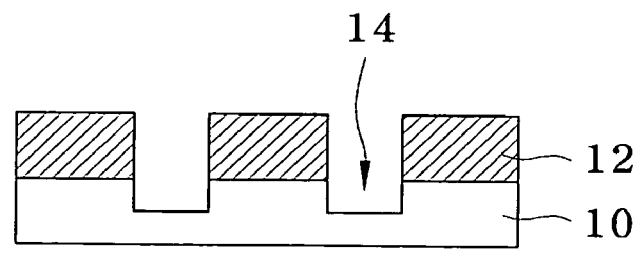

FIGS. 7a to 7c are vertical cross-sectional views taken along lines X'-X', Y'-Y', and Z'-Z' of FIG. 6, respectively.

FIG. 7a is a vertical cross-sectional view of the multi-transmission phase mask taken along the line X'-X' of FIG. 6, in which a portion of the transparent substrate 10 etched below the surface of the transmission region A' is the phase inversion region 14.

FIG. 7b is a vertical cross-sectional view of the multi-transmission phase mask taken along the line Y'-Y' of FIG. 6, in which the exposed portion of the transparent substrate 10 is the transmission region A'.

FIG. 7c is a vertical cross-sectional view of the multi-transmission phase mask taken along the line Z'-Z' of FIG. 6, in which a portion of the transparent substrate 10 etched to a predetermined depth in the light shielding film 12 is the phase inversion region 14.

As such, when the exposure process is performed by means of an exposure apparatus, such as a KrF exposure apparatus, using the multi-transmission mask in accordance with this embodiment for forming the storage node contact pattern, the phase difference of 180° arises between light transmitted through the light transmission region A', which will be formed with a storage node contact pattern and so forth, and light transmitted through the phase inversion region 14 formed on the space in the row direction between the light transmission regions A'. As a result, a countervailing phenomenon between phases of the light arises at a portion where the light transmission region A' contacts the phase inversion region 14, thereby allowing the shape of the pattern to be maintained within a predetermined range without being significantly affected by variation in the size of the mask. Accordingly, with the multi-transmission phase mask according to the present embodiment, the defect wherein a pattern unit of the storage node contact pattern is not regularly opened on the wafer due to the optical proximity phenomenon occurring in a gap between the storage node contacts, or the defect wherein the pattern units are bridged to each other can be prevented from occurring.

Meanwhile, although the phase inversion region 14 is described in the above embodiments as being formed by a method of etching the transparent substrate 10 to the predetermined depth, it is apparent that it is possible to form the phase inversion region 14 through other methods.

FIGS. 8a to 8f are diagrams illustrating multi-transmission phase masks according to various embodiments of the present invention, in which various modifications of the multi-transmission phase mask are illustrated, such as addition of an assistant pattern to the rectangular pattern in the light transmission region of the multi-transmission phase mask, adjustment of the location of the phase inversion region and the like.

Figure 8A:
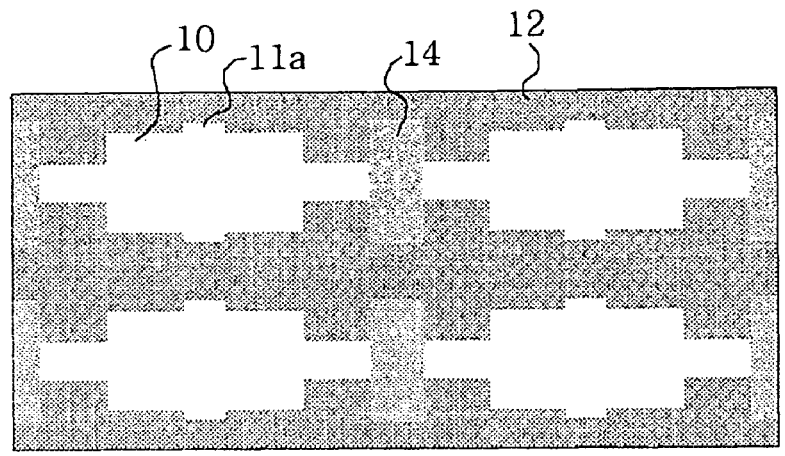
FIGS. 8a to 8f are diagrams illustrating multi-transmission phase masks according to various embodiment of the present invention, respectively.

FIG. 8a shows one example of the multi-transmission phase mask of the invention. Referring to FIG. 8a, the multi-transmission phase mask comprises a light transmission region 10 having a rectangular pattern, assistant pattern units 11a formed to four sides of the light transmission region 10, and a phase inversion region 14 having a phase of 180° in the light transmission region 10 in the direction of the row.

Figure 8B:
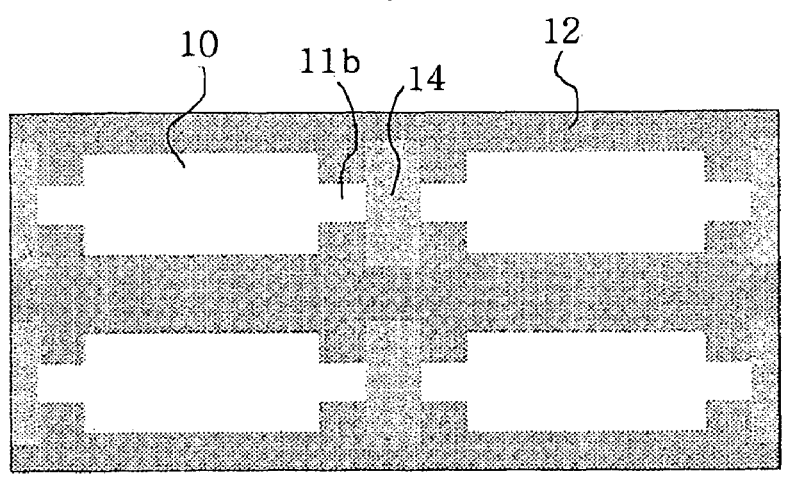

FIG. 8b shows another example of the multi-transmission phase mask of the invention. Referring to FIG. 8b, the multi-transmission phase mask comprises a light transmission region 10 having a rectangular pattern, assistant pattern units 11a formed to four sides of the light transmission region 10, and a phase inversion region 14 having a phase of 180° in the light transmission region 10 in the column direction.

Figure 8C:
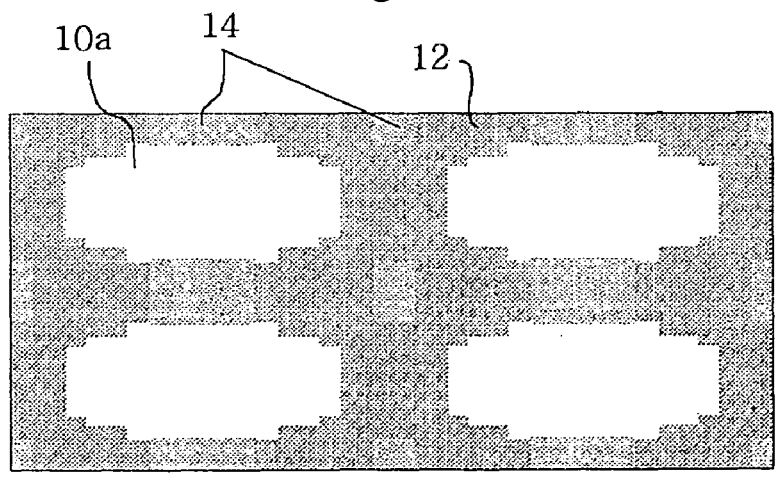

FIG. 8c shows still another example of the multi-transmission phase mask of the invention. Referring to FIG. 8c, the multi-transmission phase mask comprises a light transmission region 10a having a polygonal pattern as shown in FIG. 8c, and a phase inversion region 14 having a phase of 180° in the light transmission region 10a in the column direction, and an additional phase inversion region 14' formed at the portion where the phase inversion region 14 does not contact the light transmission region 10a.

Figure 8D:
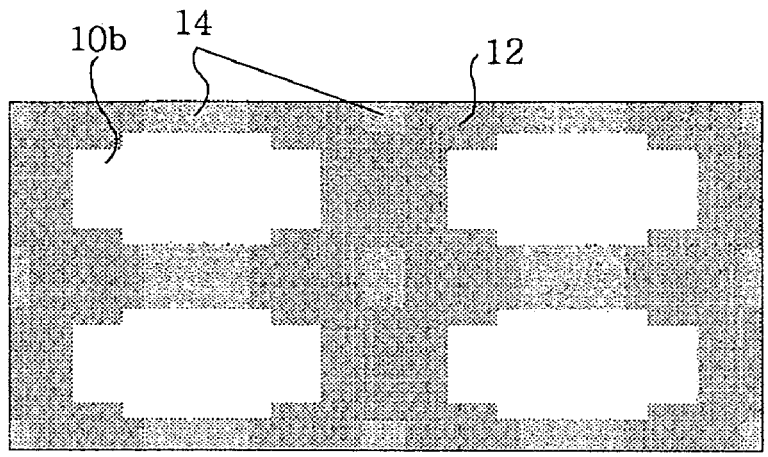

FIG. 8d shows still another example of the multi-transmission phase mask of the invention. Referring to FIG. 8d, the multi-transmission phase mask comprises a light transmission region 10a having another polygonal pattern as shown in FIG. 8d, and a phase inversion region 14 having a phase of 180° in the light transmission region 10a in the column direction, and an additional phase inversion region 14" formed at the portion where the phase inversion region 14 does not contact the light transmission region 10a.

Figure 8E:
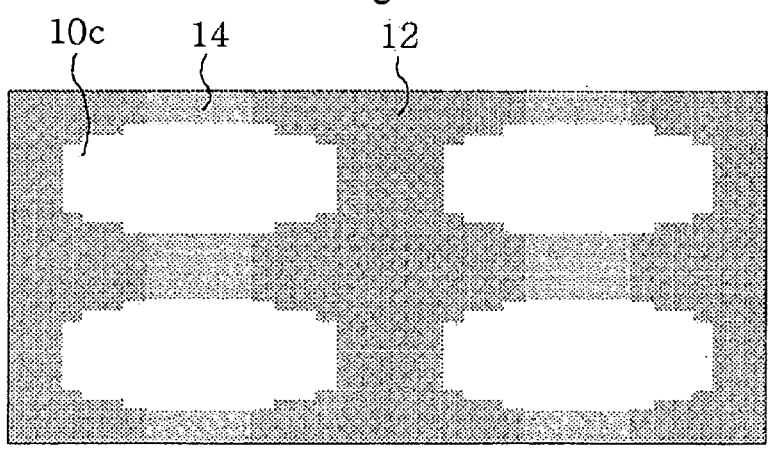

FIG. 8e shows still another example of the multi-transmission phase mask of the invention, in which the additional phase inversion region 14' is not provided to the multi-transmission phase mask shown in FIG. 8c.

Figure 8F:
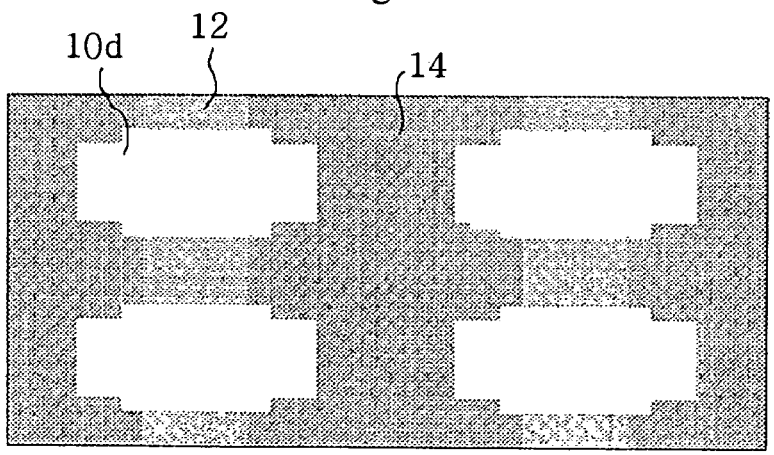

FIG. 8f shows yet another example of the multi-transmission phase mask of the invention, in which the additional phase inversion region 14" is not provided to the multi-transmission phase mask shown in FIG. 8d.

The multi-transmission phase mask of the invention may be applicable when using an ArF laser or F2 laser as well as a KrF laser for the exposure light.

As such, the multi-transmission phase mask of the invention has the phase conversion region having the phase difference of 180° for the light transmission region while having an optical transmittance of 100%, formed at a predetermined portion in the light transmission region or additionally formed at a predetermined portion where the phase conversion region does not contact the light transmission region. As a result, a countervailing phenomenon between phases arises at the space where the light transmission region contacts the phase conversion region during the exposure process, thereby ensuring a critical dimension of a pattern, such as a storage node contact pattern, formed on a wafer. In particular, when using a KrF laser for the exposure light, the critical dimension of a minute pattern, such as a fine storage node contact pattern, can be realized with high precision through the multi-transmission phase mask according to the invention, thereby preventing an expenditure caused by new installation investment for an ArF laser or F2 laser.

Meanwhile, reference numeral 12, although not described in FIGS. 8a to 8f, denotes a light shielding film formed on the transparent substrate in order to define the light transmission region.

Figure 9:
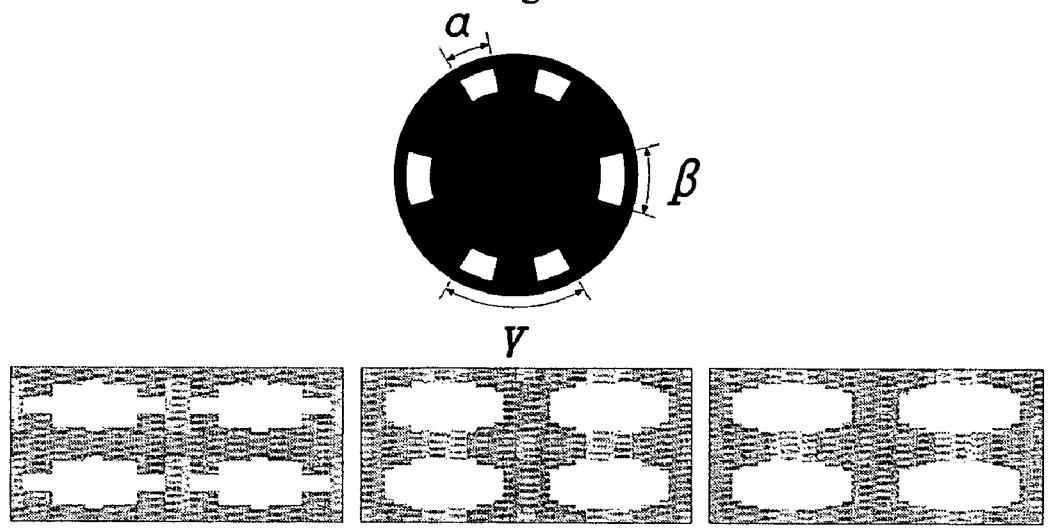
FIG. 9 shows one example of a modified illumination system employed when manufacturing the multi-transmission phase mask of the present invention.

An exposure method according to one preferred embodiment of the invention is characterized in that the method uses the multi-transmission phase mask as described above, and in that a pattern of a semiconductor diode is exposed on a wafer by illuminating exposure light to the multi-transmission phase mask through a modified illumination system comprising at least two poles, each having preset opening angles $\alpha$, $\beta$ and $\gamma$, as shown in FIG. 9.

FIG. 9 shows one example of the modified illumination system used for the invention. The modified illumination system as shown in FIG. 9 is a modified illumination system comprising the at least two poles, for example, a hexapole. Each pole of the hexapole has preset opening angles, for example, an opening angle α of 15° to a vertical axis, an opening angle β of 15° to a horizontal axis, and an opening angle γ of 60° defined by a pair of poles.

The number of open poles, opening angles of the open pole, and direction of each opening angle in the modified illumination system are determined according to the location of the phase inversion region in the multi-transmission phase mask.

Figure 10A:
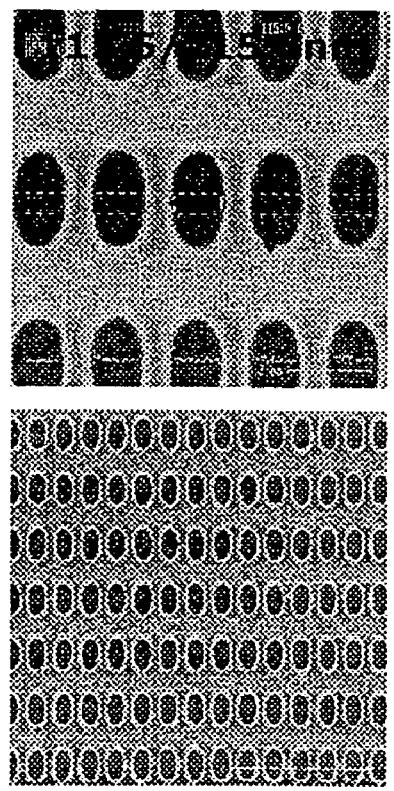
FIGS. 10a to 10c show examples of a storage node contact pattern exposed on a wafer by means of the multi-transmission phase mask of the invention and the modified illumination system.
Figure 10B:
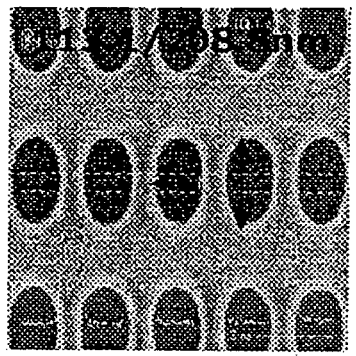
Figure 10B:
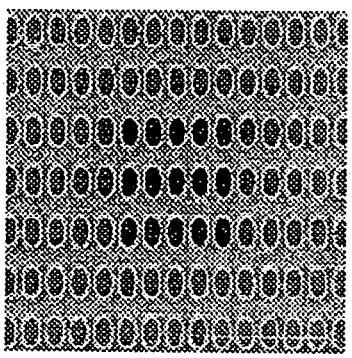
Figure 10C:
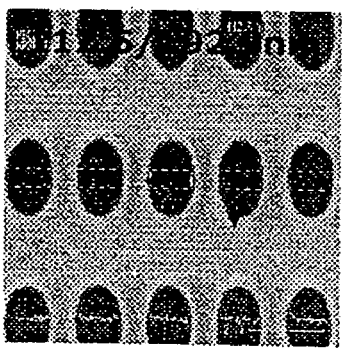
Figure 10C:
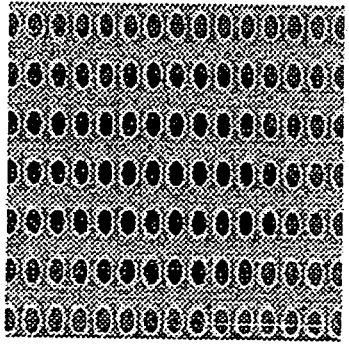

FIGS. 10a to 10c show examples of a storage node contact pattern exposed on a wafer when the exposure process is performed using the multi-transmission phase mask of the invention and the modified illumination system.

When the exposure process is performed on a wafer by means of a 0.80 NA KrF exposure apparatus using the modified illumination system as shown in FIG. 9 and the multi-transmission phase masks with the storage node contact pattern having a half pitch of 95 nm as shown in FIGS. 8a, 8c and 8e, images of a uniform storage node contact pattern as shown in FIGS. 10a, 10b and 10c are formed on the wafer. At this time, a depth of focus (DOF) is 0.5 μm in each case, and exposure limits (EL) are 12.7%, 14.1% and 12.6% in FIGS. 10a, 10b and 10c upon the exposure process, respectively.

The exposure method as described above may be applied to an immersion type exposure method.

As apparent from the above description, when the exposure process is conducted using the multi-transmission phase mask according to the invention, the countervailing phenomenon due to the phase difference of 180° between the light transmission region where the storage node contact pattern is formed and the phase conversion region formed to contact the light transmission region allows the critical dimension of the pattern on the wafer to be ensured, thereby preventing the defect wherein a pattern unit of the storage node contact pattern is not regularly opened on the wafer due to the optical proximity phenomenon occurring in the gap between the storage node contacts, or the defect wherein the pattern units are bridged to each other. Additionally, when using a KrF laser as the exposure light source, the critical dimension of the minute pattern, such as the minute storage node contact pattern, can be realized with high precision through the multi-transmission phase mask according to the invention, thereby preventing the expenditure caused by new installation investment for an ArF laser or F2 laser.

Furthermore, when using a modified illumination system, such as that having the hexapole, the phase and optical transmittance of the mask can be adjusted, thereby realizing the critical dimension of a fine and repetitious pattern of the semiconductor diode with precision.

It should be understood that the embodiments and the accompanying drawings have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A multi-transmission phase mask used for an exposure apparatus, comprising:
  a transparent substrate;
  a light shielding film formed on the transparent substrate, wherein the light shielding film defines a light shielding region where the light shielding film is formed and a light transmission region on the transparent substrate where the light shielding film is not formed; and
  a phase inversion region formed on a predetermined portion of the light transmission region so as to allow exposure light to be transmitted therethrough with a phase of the light being inverted,
  wherein portions of the phase inversion region alternate with portions of the light transmission region in a predetermined direction, wherein each portion of the phase inversion region directly contacts at least two adjacent portions of the light transmission region in the predetermined direction and each portion of the light transmission region directly contacts at least two adjacent portions of the phase inversion region in the predetermined direction,
  wherein portions of the phase inversion region alternate with portions of the light shielding region in a direction perpendicular to the predetermined direction, wherein each portion of the phase inversion region directly contacts at least two adjacent portions of the light shielding region in the direction perpendicular to the predetermined direction, and
  wherein portions of the light transmission region alternate with portions of the light shielding region in the direction perpendicular to the predetermined direction, and each portion of the light transmission region directly contacts at least two adjacent portions of the light shielding region in the direction perpendicular to the predetermined direction.

2. The mask according to claim 1, wherein the phase inversion region is formed by etching the transparent substrate at the predetermined portion of the light transmission region to a predetermined depth.

3. The mask according to claim 1, wherein the phase inversion region has a phase difference of 180° to the light transmission region.

4. The mask according to claim 1, wherein the exposure light is produced by one of a KrF laser, ArF laser and F2 laser.

5. The mask according to claim 1, wherein the light shielding film is one of a chrome film and a half tone film allowing a portion of light to be transmitted while inverting the phase of the light.

6. The mask according to claim 1, wherein the light shielding film is a selective combination of a chrome film and a half tone film allowing a portion of light to be transmitted while inverting the phase of the light.

7. An exposure method using the mask according to claim 1, the method comprising:
  exposing a pattern of a semiconductor diode on a wafer by illuminating exposure light to the mask through a modified illumination system comprising at least two poles, wherein each pole has a preset opening angle.

8. The method according to claim 7, wherein the phase inversion region is formed by etching the transparent substrate at the predetermined portion of the light transmission region to a predetermined depth.

9. The method according to claim 7, wherein the phase inversion region has a phase difference of 180° to the light transmission region.

10. The method according to claim 7, wherein the exposure light is produced by one of a KrF laser, ArF laser and F2 laser.

11. The method according to claim 7, wherein the light shielding film is one of a chrome film and a half tone film allowing a portion of light to be transmitted while inverting the phase of the light.

12. The method according to claim 7, wherein the light shielding film is a selective combination of a chrome film and a half tone film allowing a portion of light to be transmitted while inverting the phase of the light.

13. The method according to claim 7, wherein the exposure method is an immersion type exposure method.

14. The method according to claim 7, wherein the modified illumination system has a hexapole.

* * * * *